United States Patent
Moulard

(10) Patent No.: US 11,362,638 B2
(45) Date of Patent: Jun. 14, 2022

(54) BULK ACOUSTIC WAVE RESONATOR WITH A HEATSINK REGION AND ELECTRICAL INSULATOR REGION

(71) Applicant: RF360 EUROPE GMBH, Munich (DE)

(72) Inventor: Gilles Moulard, Munich (DE)

(73) Assignee: RF360 Europe GmbH, San Diego, CA (US)

( * ) Notice: Subject to any disclaimer, the term of this patent is extended or adjusted under 35 U.S.C. 154(b) by 25 days.

(21) Appl. No.: 16/997,450

(22) Filed: Aug. 19, 2020

(65) Prior Publication Data

US 2022/0060165 A1    Feb. 24, 2022

(51) Int. Cl.
*H03H 9/02* (2006.01)
*H03H 9/13* (2006.01)
*H03H 9/17* (2006.01)
*H03H 9/54* (2006.01)

(52) U.S. Cl.
CPC ...... *H03H 9/02102* (2013.01); *H03H 9/0211* (2013.01); *H03H 9/02015* (2013.01); *H03H 9/131* (2013.01); *H03H 9/17* (2013.01); *H03H 9/54* (2013.01)

(58) Field of Classification Search
CPC ........... H03H 9/02015; H03H 9/02102; H03H 9/0211; H03H 9/131; H03H 9/17; H03H 9/54
USPC ........................................ 333/133, 187, 188
See application file for complete search history.

(56) References Cited

U.S. PATENT DOCUMENTS

| | | | |
|---|---|---|---|
| 2011/0080232 A1* | 4/2011 | Bar ................. | H03H 9/175 333/187 |
| 2015/0094000 A1* | 4/2015 | Aigner ............. | H03H 9/02102 455/73 |
| 2016/0352308 A1 | 12/2016 | Ivira et al. | |
| 2017/0272053 A1 | 9/2017 | Tag et al. | |
| 2020/0136585 A1* | 4/2020 | Park ................ | H03H 9/02102 |

FOREIGN PATENT DOCUMENTS

WO    2019110504 A1    6/2019

OTHER PUBLICATIONS

International Search Report and Written Opinion—PCT/US2021/043522—ISA/EPO—dated Dec. 3, 2021.

* cited by examiner

*Primary Examiner* — Rakesh B Patel
*Assistant Examiner* — Jorge L Salazar, Jr.
(74) *Attorney, Agent, or Firm* — RF360 Europe GmbH

(57) ABSTRACT

Certain aspects of the present disclosure provide a bulk acoustic wave (BAW) resonator having a substrate with a heatsink region and an electrical insulator region. An example electroacoustic device generally includes a piezoelectric layer, a first electrode structure, a second electrode structure, one or more reflector layers, and a substrate having a heatsink region and an electrical insulator region. The heatsink region is arranged under a first portion of the first electrode structure, the first portion of the first electrode structure overlapping the second electrode structure. The insulator region is arranged under a second portion of the first electrode structure, the second portion of the first electrode structure being adjacent to the first portion of the first electrode structure.

27 Claims, 7 Drawing Sheets

BULK ACOUSTIC WAVE RESONATOR WITH A HEATSINK REGION AND ELECTRICAL INSULATOR REGION

BACKGROUND

Field of the Disclosure

Aspects of the present disclosure relate to electronic devices, and more particularly, to a bulk acoustic wave (BAW) resonator having a substrate with a heatsink region and an electrical insulator region.

Description of Related Art

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. Wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., IEEE 802.11), and the like.

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 500 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

As the number of frequency bands used in wireless communications increases and as the desired frequency band of filters widen, the performance of acoustic filters increases in importance to reduce resistive losses, increase attenuation of out-of-band signals, and increase overall performance of electronic devices. Acoustic filters with improved performance are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include desirable performance from a bulk acoustic wave resonator at high operating powers due to the heat dissipation provided by the substrate described herein.

Certain aspects of the present disclosure can be implemented in an electroacoustic device. The electroacoustic device generally includes a piezoelectric layer, a first electrode structure, a second electrode structure, one or more reflector layers, and a substrate. The first electrode structure is disposed above the piezoelectric layer. The second electrode structure is disposed below the piezoelectric layer, such that a portion of the second electrode structure is arranged under the first electrode structure. The one or more reflector layers are disposed below the second electrode structure. The substrate is disposed below the one or more reflector layers, such that the substrate is arranged under the first electrode structure and the second electrode structure, wherein the substrate comprises a heatsink region and an electrical insulator region. The heatsink region is arranged under a first portion of the first electrode structure, the first portion of the first electrode structure overlapping the second electrode structure. The insulator region is arranged under a second portion of the first electrode structure, the second portion of the first electrode structure being adjacent to the first portion of the first electrode structure.

Certain aspects of the present disclosure can be implemented in an electroacoustic device. The electroacoustic device generally includes a piezoelectric layer, a first electrode structure disposed above the piezoelectric layer, and a second electrode structure disposed below the piezoelectric layer, such that a portion of the second electrode structure is arranged under the first electrode structure. The electroacoustic device also includes means for reflecting an acoustic wave disposed below the second electrode structure. The electroacoustic device further includes a substrate disposed below the means for reflecting, such that the substrate is arranged under the first electrode structure and the second electrode structure. The substrate comprises means for transferring heat from an active region where the first electrode structure and the second electrode structure excite vibrations in the piezoelectric layer, and means for electrically insulating the means for transferring heat from an electric field generated by the first electrode structure. The means for transferring heat is arranged under a first portion of the first electrode structure, the first portion of the first electrode structure overlapping the second electrode structure. The means for electrically insulating is arranged under a second portion of the first electrode structure, the second portion of the first electrode structure being adjacent to the first portion of the first electrode structure.

Certain aspects of the present disclosure can be implemented as a method of filtering an electrical signal via an electroacoustic device, where the piezoelectric comprises a piezoelectric layer, a first electrode structure disposed above the piezoelectric layer, a second electrode structure disposed below the piezoelectric layer, one or more reflector layers disposed below the second electrode structure, and a substrate disposed below the one or more reflector layers. The method generally includes applying the electrical signal to the first electrode structure and obtaining a filtered electrical signal from the second electrode structure. The method also includes transferring heat to a heatsink region of the substrate from an active region where the first electrode structure and the second electrode structure excite vibrations in the piezoelectric layer, wherein the heatsink region is arranged under a first portion of the first electrode structure, the first portion of the first electrode structure overlapping the second electrode structure. The method further includes electrically insulating, with an insulator region of the substrate, the heatsink region from an electric field generated by the first electrode structure, wherein the insulator region is arranged under a second portion of the first electrode structure, the second portion of the first electrode structure being adjacent to the first portion of the first electrode structure.

Certain aspects of the present disclosure can be implemented as a method of fabricating an electroacoustic device. The method generally includes forming a substrate comprising a heatsink region and an electrical insulator region, forming one or more reflector layers above the substrate, forming a first electrode structure above the one or more reflector layers, forming a piezoelectric layer above the first electrode structure, and forming a second electrode structure above the piezoelectric layer, such that a portion of the first electrode structure is arranged under the second electrode structure. The heatsink region is arranged under a first portion of the second electrode structure, the first portion of the second electrode structure overlapping the first electrode structure. The insulator region is arranged under a second portion of the second electrode structure, the second portion of the second electrode structure being adjacent to the first portion of the second electrode structure.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1A:
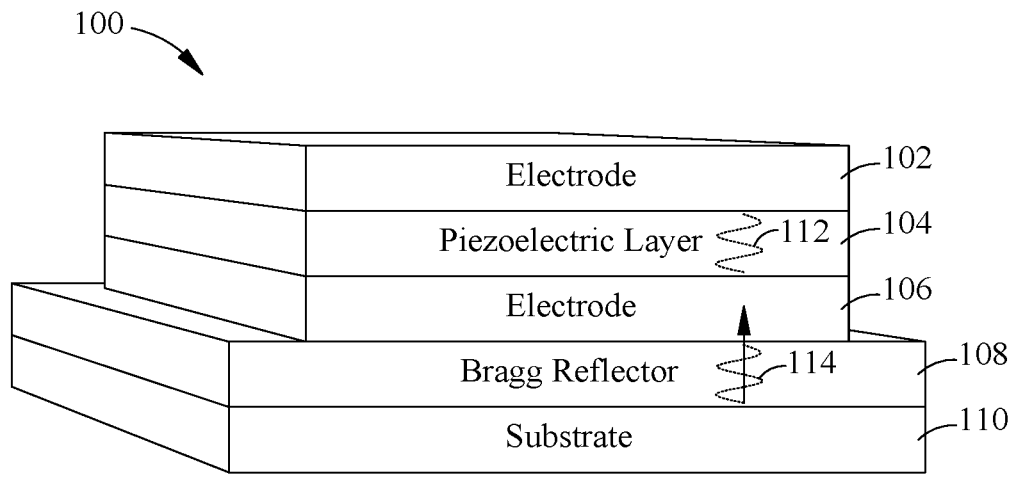
FIG. 1A is a diagram conceptually illustrating an example electroacoustic device, in accordance with certain aspects of the present disclosure.

Aspects of the present disclosure provide an electroacoustic device having a substrate with a heatsink region and an electrical insulator region.

Electroacoustic devices such as bulk acoustic wave (BAW) resonators, which employ a piezoelectric material arranged between electrode structures, are being designed to cover more frequency ranges (e.g., 500 MHz to 7 GHz), to have higher bandwidths (e.g., up to 20%), and to have improved efficiency and performance. In general, a BAW resonator is an electromechanical device in which a standing acoustic wave is generated by an electrical signal in the bulk of a piezoelectric material arranged between electrodes to which the electrical signal is applied. Due to the high operating powers for certain electroacoustic devices, certain BAW resonators may encounter high thermal self-heating. For example, certain BAW resonators may experience temperatures as high as 660 kelvin (K). The self-heating of the BAW resonator may be transferred to a substrate with a relatively high thermal conductivity, such as a silicon (Si) substrate. As silicon becomes conductive when temperatures rise above 180° Celsius, a silicon substrate may facilitate electrical leakage from the electrodes of certain BAW resonators, resulting in degradation of the filter performance (such as a high frequency shift and/or reliability issues). For example, a relatively high electric field extends from the top electrode to the bottom electrode through the piezoelectric layer and a portion of the silicon substrate. The electric field penetrates a few tens of micrometers deep into the silicon substrate, which, due to the high but finite resistance of the silicon substrate, induces parasitic electrical losses in certain BAW resonators.

Certain BAW resonators (such as thin film bulk acoustic resonators (FBARs)) have used a thick interposer dielectric layer below a cavity—which is disposed below the edge of the bottom electrode—to reduce the electrical losses. The interposer dielectric layer may be made of silicon dioxide ($SiO_2$), which has a low thermal conductivity, and thus, the heat generated by self-heating may not be adequately dissipated for certain operating temperatures and/or operating powers. Such an interposer dielectric layer arranged below a Bragg reflector of a solidly mounted resonator (SMR) may not be adequate for dissipating the heat generated by the SMR.

Certain aspects of the present disclosure relate to an electroacoustic device having a substrate with a heatsink region and an electrical insulator region. In aspects, the electrical insulator region may be arranged where the electric field from the top electrode may penetrate the substrate, for example, at the resonator edge where the top electrode begins to overlap with the bottom electrode (i.e., the edge of the bottom electrode) (such as an overlapping portion of the bottom electrode and top electrode) and/or where the top electrode does not overlap with the bottom electrode (such as a non-overlapping portion of the top electrode). The heatsink region may be arranged under the remaining overlapping portion of the electrodes to facilitate desirable heat dissipation. As an example, the insulator region may be a thick silicon dioxide layer, which is embedded in a silicon substrate, at the resonator edge. The rest of the electrodes and a piezoelectric material may be arranged above the silicon substrate. The substrate design described herein may enable an electroacoustic device (e.g., a SMR) to be kept at a low temperature, even when using the electroacoustic device at certain high power, which may prevent or reduce a frequency shift in the electroacoustic device and provide desirable reliability.

In certain aspects, the substrate design described herein may be implemented with an SMR. An advantage of the SMR is that the conductive material in the reflective layers of the Bragg reflector may serve as electric shielding in the acoustic region, such that the Bragg reflector prevents or reduces electric field penetration into a certain portion of the substrate, enabling the insulator region to be disposed at the resonator edge, where there may be high electric field penetration. That is, the insulator region may be arranged under the top electrode connection area, where a relatively high electric field is created between the top electrode and the edge of the bottom electrode, and the Bragg reflector may serve as electric shielding for the remaining portion of the resonator. The substrate design described herein along with the Bragg reflector may prevent or reduce the electric field penetration into the substrate. In certain aspects, the substrate design described herein along with the Bragg reflector may enable desirable performance from the SMR at high operating powers due to the heat dissipation provided by the substrate.

Example Electroacoustic Device

FIG. 1A is a diagram of a perspective view of an example electroacoustic device 100, in accordance with certain aspects of the present disclosure. The electroacoustic device 100 may be configured as or be a portion of a BAW resonator. In certain descriptions herein, the electroacoustic device 100 may be referred to as a BAW resonator. In aspects, the BAW resonator is a solidly mounted resonator (SMR). In certain cases, a wireless communication apparatus may include the BAW resonator, for example, as further described herein with respect to FIGS. 3, 6, and 7.

As shown, the electroacoustic device 100 includes a first electrode structure 102, a piezoelectric layer 104, a second electrode structure 106, one or more reflector layers 108, and a substrate 110. In certain aspects, the electroacoustic device 100 may further include various dielectric layers (not shown) arranged between the piezoelectric layer 104 and the first electrode structure 102 and/or the second electrode structure 106 for various reasons like temperature compensation, acoustic decoupling, or power durability.

The first electrode structure 102 is disposed above the piezoelectric layer 104. The first electrode structure 102 may include an electrically conductive material such as a metal or metal alloy including aluminum (Al), chromium (Cr), cobalt (Co), copper (Cu), gold (Au), molybdenum (Mo), platinum (Pt), ruthenium (Ru), tantalum (Ta), titanium (Ti), tungsten (W), or a combination thereof. In certain cases, the conductive material may include graphene or other electrically conductive, non-metallic materials. The first electrode structure 102 may have various forms such as an electrode plate or a comb-like structure with electrode fingers.

The piezoelectric layer 104 is disposed between the first electrode structure 102 and second electrode structure 106. The piezoelectric layer 104 may include a piezoelectric material such as aluminum nitride (AlN), zinc oxide (ZnO), a quartz crystal (such as lithium tantalate ($LiTaO_3$) or lithium niobite ($LiNbO_3$)), doped variants of these, or other suitable piezoelectric materials.

The second electrode structure 106 is disposed below the piezoelectric layer 104, such that a portion of the second electrode structure 106 is arranged directly under a portion of the first electrode structure 102. That is, portions of the first and second electrode structures 102, 106 may overlap with each other. The second electrode structure 106 may include an electrically conductive material such as a metal or metal alloy, for example, as described herein with respect to the first electrode structure 102. The second electrode structure 106 may have various forms such as an electrode plate or a comb-like structure with electrode fingers. In certain aspects, the second electrode structure 106 may have the same form or structure as the first electrode structure 102. For example, the first and second electrode structures 102, 106 may both be electrode plates. In certain cases, the second electrode structure 106 may have a different form or structure as the first electrode structure 102. For example, the first electrode structure 102 may be a comb-like electrode structure and the second electrode structure 106 may be an electrode plate.

The one or more reflector layers 108 may be disposed below the second electrode structure 106. The one or more reflector layers 108 may serve as a Bragg reflector to acoustically isolate the BAW resonator from the substrate 110 or reduce the acoustic coupling between the BAW resonator and the substrate 110. In general, the one or more reflector layers 108 may include alternating layers of materials having low acoustic impedance and materials having a high acoustic impedance, as further described herein with respect to FIG. 1B.

The substrate 110 may be disposed below the one or more reflector layers 108, such that the substrate 110 is arranged under the first electrode structure 102 and the second electrode structure 106. The substrate 110 may serve as a carrier for the BAW resonator. In aspects, the substrate 110 may be formed from a semiconductor wafer such as a silicon wafer. As further described herein with respect to FIG. 2, the substrate 110 may include a heatsink region and an electrical insulator region (neither shown in FIGS. 1A and 1B).

An electrical signal excited in the first electrode structure 102 (e.g., applying an AC voltage) is transformed into an acoustic wave 112 that propagates in a particular direction via the piezoelectric layer 104. That is, applying an electrical signal to the piezoelectric layer 104 through the first electrode structure 102 transduces the electrical signal to the acoustic wave 112 in the piezoelectric layer 104. The acoustic wave 112 is transformed back into an electrical signal via the second electrode structure 106, which provides the electrical signal as an output. That is, the acoustic wave 112 is transduced into an electrical signal via the second electrode structure 106. The one or more reflector layers 108 may also reflect an acoustic wave 114 towards the piezoelectric layer 104 from the one or more reflector layers 108. The reflected acoustic waves 114 may enhance the efficiency of the BAW resonator and acoustically de-couple the substrate 110 from the BAW resonator. In many applications, the piezoelectric layer 104 has a particular crystal orientation such that when the first electrode structure 102 is arranged relative to the crystal orientation of the piezoelectric layer 104, the acoustic wave mainly propagates in a direction from the first electrode structure 102 to the second electrode structure 106.

Figure 1B:
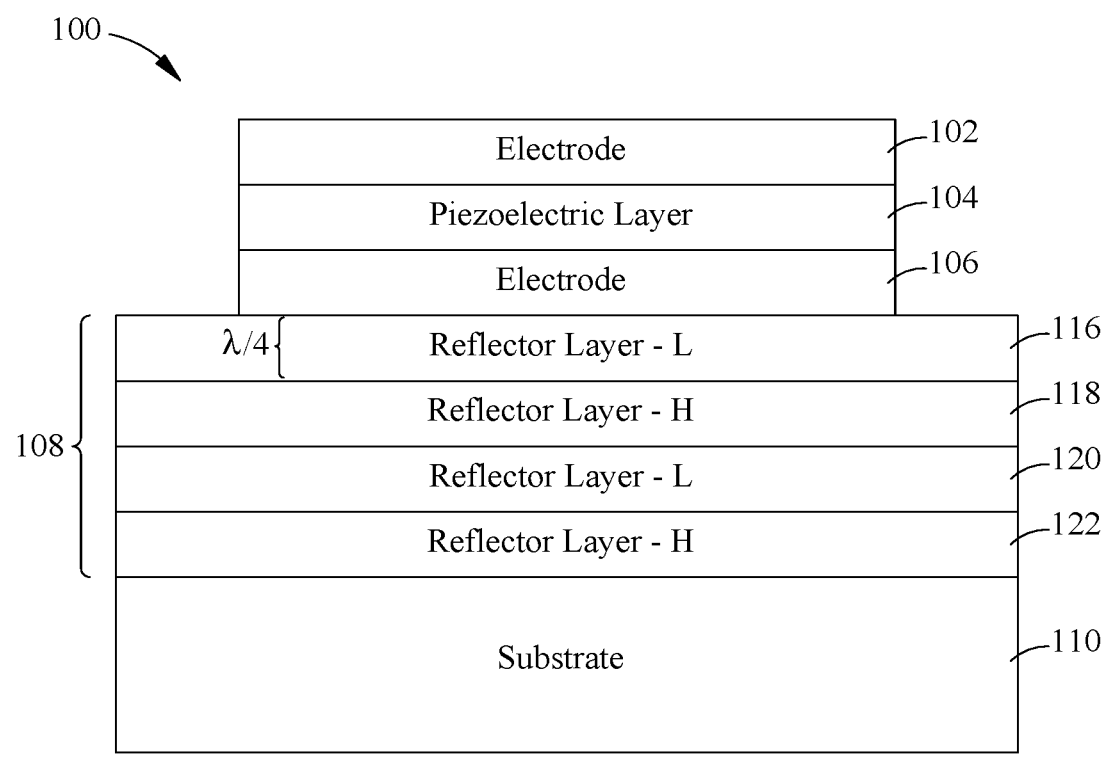
FIG. 1B is a diagram illustrating a cross-section of the example electroacoustic device of FIG. 1A, in accordance with certain aspects of the present disclosure.

FIG. 1B is a diagram of a side view of the electroacoustic device 100 of FIG. 1A, in accordance with certain aspects of the present disclosure. The electroacoustic device 100 is illustrated by a simplified layer stack including the first electrode structure 102, the piezoelectric layer 104, the second electrode structure 106, the one or more reflector layers 108, and the substrate 110.

In this example, the one or more reflector layers 108 include a first reflector layer 116, a second reflector layer 118, a third reflector layer 120, and a fourth reflector layer 122. In certain cases, the one or more reflector layers 108 may have any suitable number of reflector layers, such as fewer or more than four reflector layers as depicted in this example. The first reflector layer 116 and third reflector layer 120 may include a material having an acoustic impedance that is lower than the acoustic impedance of the second reflector layer 118 and fourth reflector layer 122. For example, the first reflector layer 116 and third reflector layer 120 may include silicon dioxide ($SiO_2$) or aluminum nitride (AlN), whereas the second reflector layer 118 and fourth reflector layer 122 may include tungsten (W) or other suitable materials with a higher acoustic impedance than silicon dioxide or aluminum nitride. In certain cases, the second reflector layer 118 and/or fourth reflector layer 122 may include a material that is electrically conductive to provide electrical shielding between the electrode structures 102, 106 and a portion of the substrate 110, as further described herein with respect to FIG. 2.

The one or more reflector layers 108 may have the same thickness (e.g., a quarter wavelength ($\lambda/4$) in thickness) or vary in thickness. While in this example, the one or more reflector layers 108 are depicted as having the same length, the one or more or more reflector layers 108 may vary in length, as further described herein with respect to FIG. 2.

Figure 2:
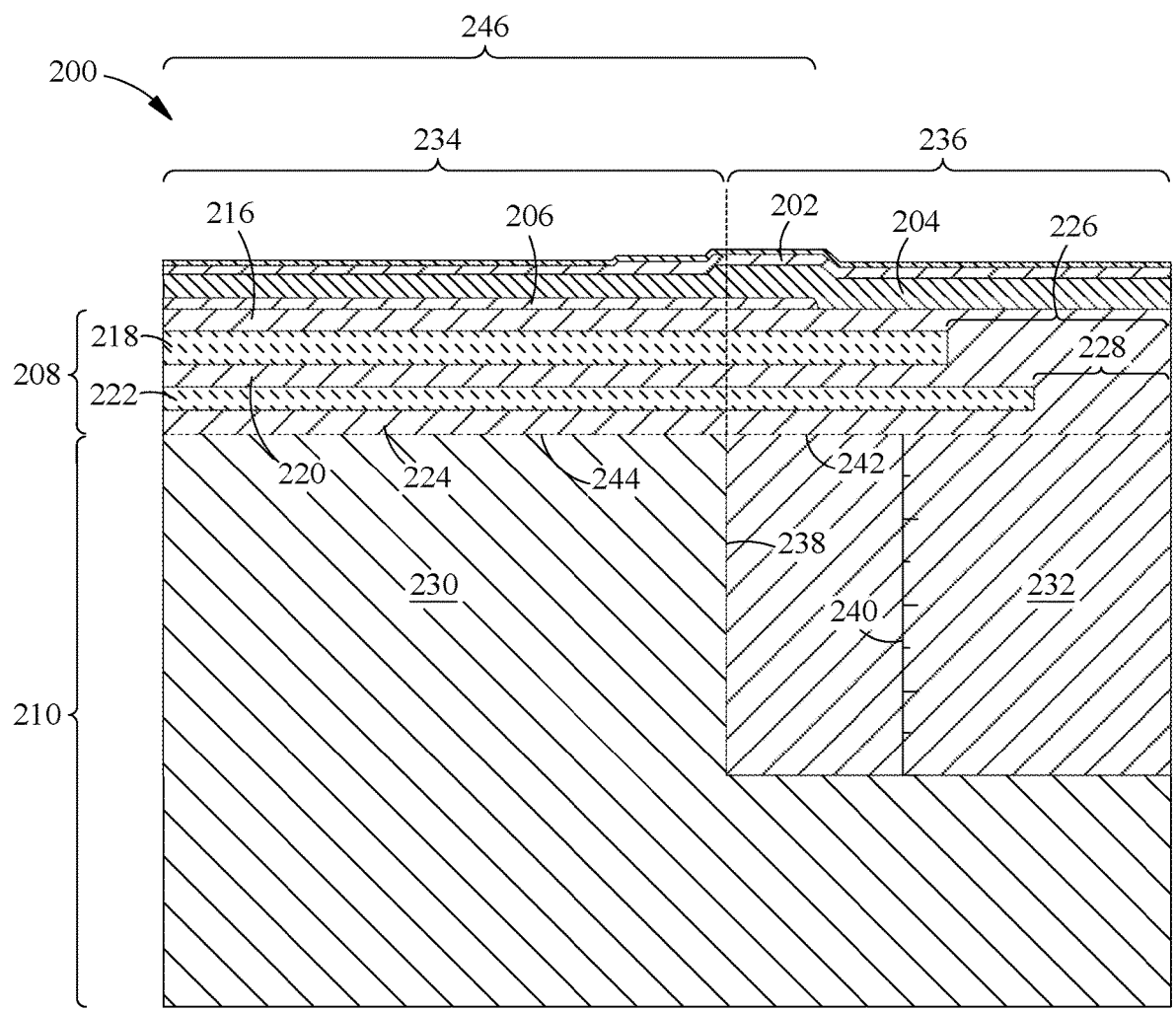
FIG. 2 is a cross-section of an example electroacoustic device having a substrate with a heatsink region and an electrical insulator region, in accordance with certain aspects of the present disclosure.

In certain aspects, the substrate includes a heatsink region and an electrical insulator region which prevents or reduces an electric field of the first electrode structure from penetrating a certain portion of the substrate, such as on the edge of the Bragg reflector or where the first electrode structure begins to overlap with the second electrode structure. For example, FIG. 2 is a cross-section illustrating further details of a portion of an electroacoustic device 200 (such as the electroacoustic device 100), at an edge of the BAW resonator, in accordance with certain aspects of the present disclosure. As shown, the electroacoustic device 200 includes a first electrode structure 202, a piezoelectric layer 204, a second electrode structure 206, one or more reflector layers 208, and a substrate 210.

The first electrode structure 202 is disposed above the piezoelectric layer 204. In this example, a particular portion of the electrode structure 202 may not overlap with the second electrode structure 206, which may be a region where an electric field of the first electrode structure 202 may penetrate a certain portion of the substrate 210.

The piezoelectric layer 204 may be disposed between the first electrode structure 202 and second electrode structure 206. In this example, a particular portion of the piezoelectric layer 204 may not overlap with the second electrode structure 206, such that at least part of this particular portion of the piezoelectric layer 204 is disposed between the first electrode structure 202 and the one or more reflector layers 208.

The one or more reflector layers 208 may be disposed below the first electrode structure 202, the piezoelectric layer 204, and the second electrode structure 206. In this example, the one or more reflector layers 208 include a first reflector layer 216, a second reflector layer 218, a third reflector layer 220, a fourth reflector layer 222, and a fifth reflector layer 224. In certain cases, the one or more reflector layers 208 may have any suitable number of reflector layers, such as fewer or more than five reflector layers as depicted in this example. The first reflector layer 216 is disposed above the second reflector layer 218, which is disposed above the third reflector layer 220. The fourth reflector layer 222 is disposed between the third reflector layer 220 and the fifth reflector layer 224.

The first reflector layer 216, third reflector layer 220, and fifth reflector layer 224 may include a material having an acoustic impedance that is lower than the acoustic impedance of the second reflector layer 218 and fourth reflector layer 222, or vice versa. For example, the first reflector layer 216, third reflector layer 220, and fifth reflector layer 224 may include silicon dioxide ($SiO_2$) or aluminum nitride (AlN), and the second reflector layer 218 and fourth reflector layer 222 may include tungsten (W) or other suitable materials with a higher acoustic impedance than silicon dioxide or aluminum nitride. In certain aspects, the lengths of the second reflector layer 218 and fourth reflector layer 222 may vary such that the lengths of the second reflector layer 218 and fourth reflector layer 222 are configured to provide a desirable reflection towards the piezoelectric layer 204. In aspects, an electrical insulator or dielectric (such as silicon dioxide or aluminum nitride) may be disposed in the regions 226, 228 laterally adjacent to the second reflector layer 218 and fourth reflector layer 222, respectively.

In this example, portions of the second reflector layer 218 and fourth reflector layer 222 may not be overlapped by the second electrode structure 206, such that portions of the first reflector layer 216 and the third reflector layer 220 are disposed between the piezoelectric layer 204 and the portions of the second reflector layer 218 and fourth reflector layer 222, respectively, without a portion of the second electrode structure 206 disposed therebetween. In this region without the overlapping second electrode structure 206, the second reflector layer 218 and fourth reflector layer 222 may serve as electrical shielding which may reduce the strength of the electric field that penetrates the substrate 210.

Additionally, or alternatively, the one or more reflector layers 208 may include a metal layer (e.g., the second reflector layer 218 and/or fourth reflector layer 222) and a dielectric layer (e.g., the first reflector layer 216 and/or third reflector layer 220) disposed between the second electrode structure and the substrate. The metal layer may include tungsten (W), and the dielectric layer may include silicon dioxide or aluminum nitride. In certain cases, a portion of the metal layer is arranged under the first electrode structure and the second electrode structure, such that the portion of the metal layer extends past the second electrode structure. That is, the second electrode structure 206 partially overlaps with the metal layer, enabling the metal layer to serve as electrical shielding as described herein.

The substrate 210 is disposed below the one or more reflector layers 208 and comprises a heatsink region 230 and an electrical insulator region 232. The heatsink region 230 may include a material with a relatively high thermal conductivity, such as silicon. In certain aspects, the heatsink region 230 may include silicon or other suitable materials with a thermal conductivity greater than or equal to the thermal conductivity of silicon. The heatsink region 230 is arranged under a first portion 234 of the first electrode structure 202, where the first portion 234 of the first electrode structure 202 overlaps the second electrode structure 206. As this example depicts a portion of the electroacoustic device 200, the heatsink region 230 may continue to extend where the first electrode structure 202 and second electrode structure 206 overlap with each other (e.g., to the left in FIG. 2).

In certain aspects, the insulator region 232 may include an electrical insulator, such as silicone dioxide, silicon nitride, or aluminum nitride. That is, the insulator region 232 may include at least one of silicone dioxide, silicon nitride, or aluminum nitride. The insulator region 232 may be arranged under a second portion 236 of the first electrode structure 202, where the second portion 236 of the first electrode structure 202 is adjacent to the first portion 234 of the first electrode structure 202. In this example, the second portion 236 of the first electrode structure 202 partially overlaps the second electrode structure 206, such that the insulator region 232 is partially overlapped by the second electrode structure 206. The insulator region 232 may be coupled to a lateral surface 238 of the heatsink region 230, the lateral surface 238 being aligned with a junction between the first portion 234 of the first electrode structure 202 and the second portion 236 of the first electrode structure 202. Expressed another way, the lateral surface 238 may define the junction between the first portion 234 of the first electrode structure 202 and the second portion 236 of the first electrode structure 202.

In certain aspects, the edge of the insulator region 232, which engages with the heatsink region 230, may be arranged in various positions that facilitate preventing or reducing the electric field from penetrating the heatsink region 230. In certain cases, the first portion 234 of the first electrode structure 202 may be aligned with the edge of the second electrode structure 206 where the first electrode structure 202 begins to overlap the second electrode structure 206. In such a case, the insulator region 232 may not be overlapped by the second electrode structure 206, such that an edge of the insulator region 232, which engages the heatsink region 230, may be aligned with an edge of the second electrode structure 206. In certain cases, the edge of the insulator region 232, which engages the heatsink region 230, may be under the region where the first electrode structure 202 does not overlap with the second electrode structure 206, for example, under a portion of the second reflector layer 218 and/or the fourth reflector layer 222.

In certain aspects, the insulator region 232 may have a thickness 240 that facilitates preventing or reducing the electric field from penetrating the heatsink region 230. For example, the thickness 240 may be, but not limited to, 4 μm, 10 μm, or 20 μm. That is, the thickness may be in a range of 4 μm to 20 μm or other suitable thicknesses. In certain aspects, implementations of the insulator region 232 may have various thicknesses.

In certain aspects, the insulator region 232 may have an upper surface 242 aligned within an upper surface 244 of the heatsink region 230. That is, the substrate 210 may have a level upper surface including the upper surface 242 of the insulator region and the upper surface 244 of the heatsink region 230.

In certain aspects, an active region 246 of the BAW resonator (for example, where acoustic waves are excited) may be where the first electrode structure and the second electrode structure overlap with each other. Due to a portion of the first electrode structure not overlapping with the second electrode structure, an electric field from the first electrode structure 202 may penetrate into a portion of the substrate 210, such as the insulator region 232. With the second reflector layer 218 and/or fourth reflector layer 222 as well as the insulator region 232 disposed under this non-overlapping region of the first electrode structure 202, the electric field from the first electrode structure 202 may not penetrate into the heatsink region 230 of the substrate 210, or the electric field may be attenuated from causing any undesirable effects, such as shorting across the heatsink region 230. As a result, the heatsink region 230 may provide desirable thermal dissipation for the electroacoustic device 200.

Figure 3:
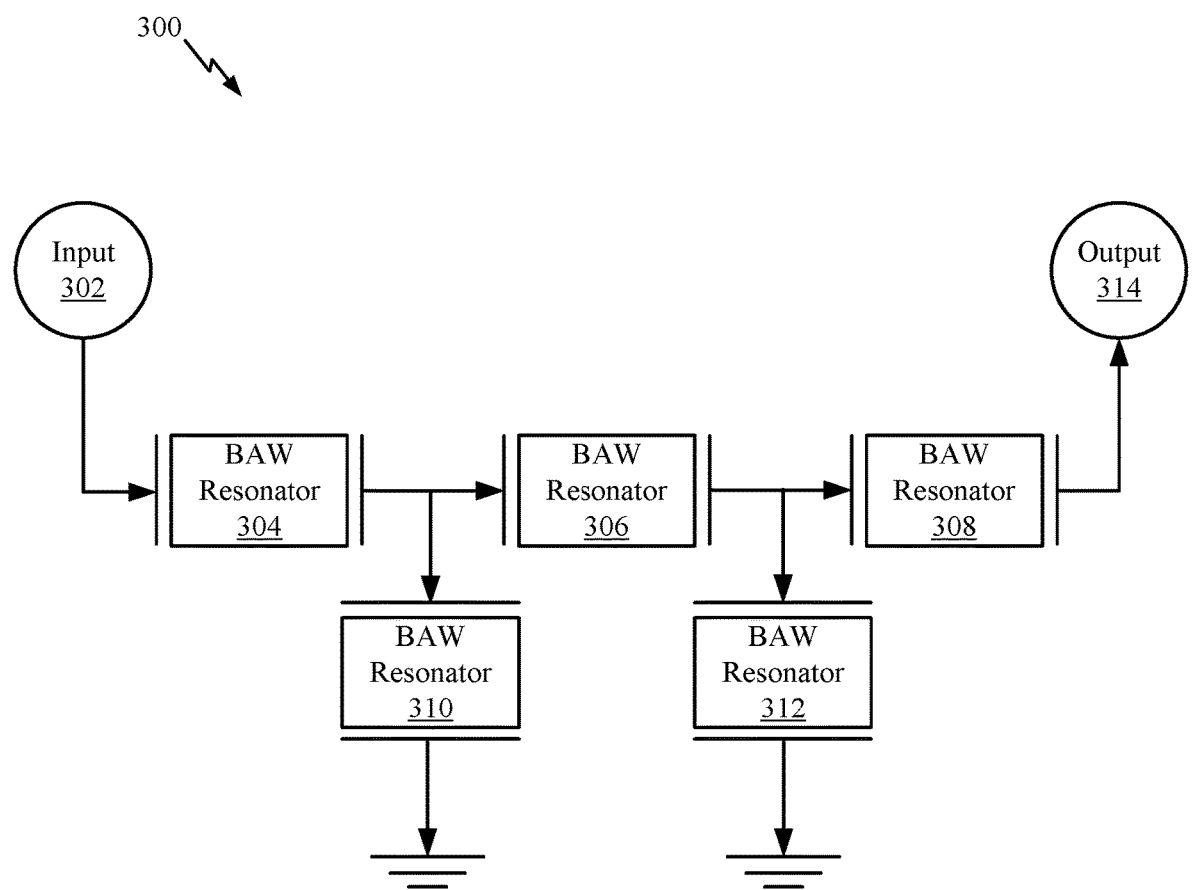
FIG. 3 is a schematic diagram of an example electroacoustic filter circuit that may include the electroacoustic device of FIG. 2, in accordance with certain aspects of the present disclosure.

In certain cases, the electroacoustic device(s) described herein may be implemented in an electroacoustic filter. For example, FIG. 3 is a schematic diagram of an electroacoustic filter circuit 300 that may include an electroacoustic device with a substrate having a heatsink region and an insulator region (such as the electroacoustic device 200). The filter circuit 300 provides one example of where the electroacoustic device 200 may be used. The filter circuit 300 includes an input terminal 302 and an output terminal 314. Between the input terminal 302 and the output terminal 314, a ladder-type network of BAW resonators is provided. The filter circuit 300 includes a first BAW resonator 304, a second BAW resonator 306, and a third BAW resonator 308 all electrically connected in series between the input terminal 302 and the output terminal 314. A fourth BAW resonator 310 (e.g., shunt resonator) has a first terminal connected between the first BAW resonator 304 and the second BAW resonator 306 and a second terminal connected to a ground potential node. A fifth BAW resonator 312 (e.g., shunt resonator) has a first terminal connected between the second BAW resonator 306 and the third BAW resonator 308 and a second terminal connected to the ground potential node. The electroacoustic filter circuit 300 may, for example, be a bandpass circuit having a passband with a selected frequency range (e.g., in a frequency range between 500 MHz and 7 GHz).

Figure 4:
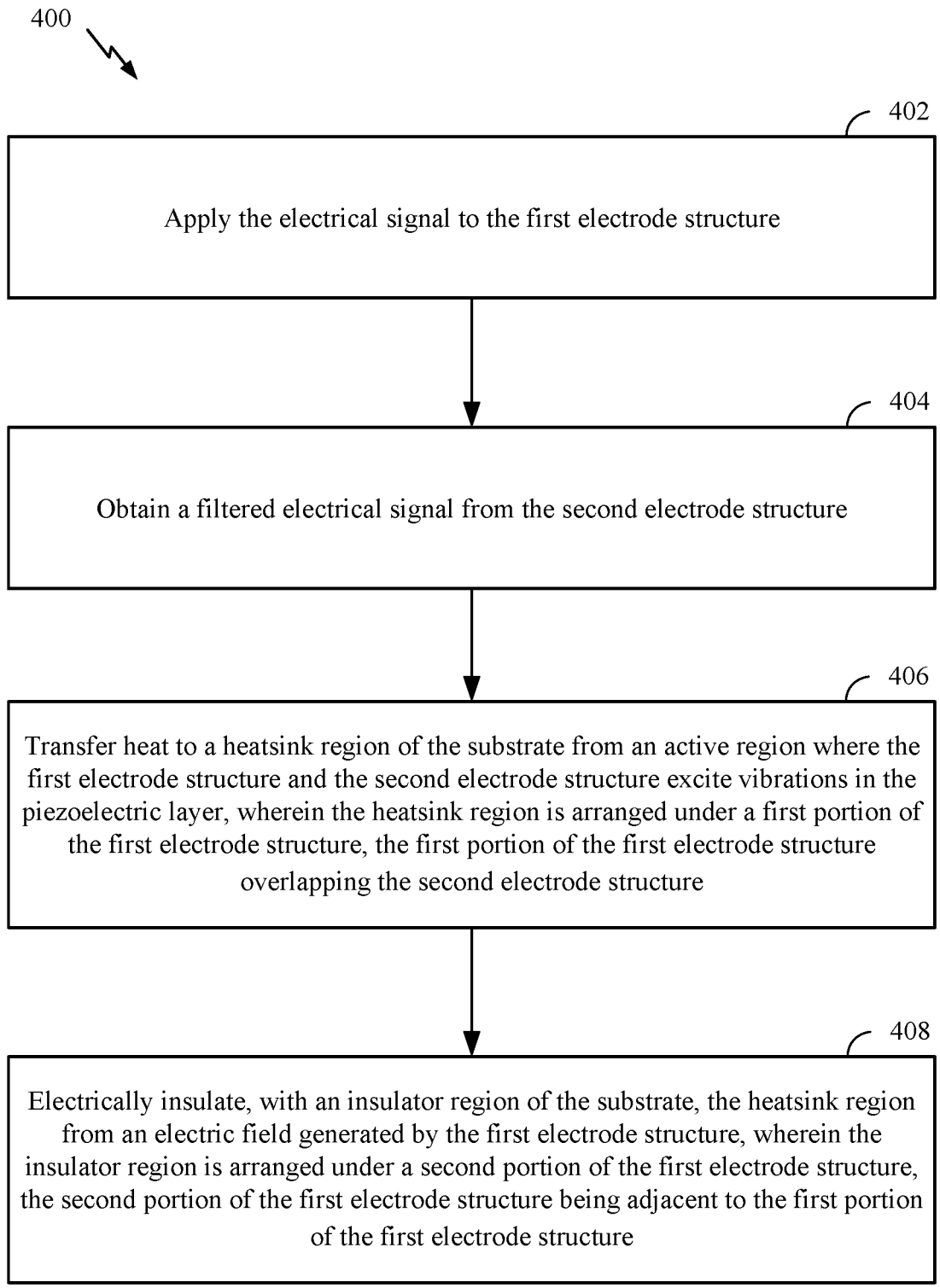
FIG. 4 is a flow diagram illustrating example operations for filtering an electrical signal via an electroacoustic device, in accordance with certain aspects of the present disclosure.

FIG. 4 is a flow diagram illustrating example operations 400 for filtering an electrical signal via an electroacoustic device (e.g., the electroacoustic device 200), in accordance with certain aspects of the present disclosure. The operations 400 may be performed, for example, by an electroacoustic filter (e.g., the electroacoustic filter circuit 300) having an electroacoustic device comprising a piezoelectric layer (e.g., the piezoelectric layer 204), a first electrode structure (e.g., the first electrode structure 202) disposed above the piezoelectric layer, a second electrode structure (e.g., the second electrode structure 206) disposed below the piezoelectric layer, one or more reflector layers (e.g., the one or more reflector layers 208) disposed below the second electrode structure, and a substrate (e.g., the substrate 210) disposed below the one or more reflector layers.

The operations 400 may begin, at block 402, by applying the electrical signal to the first electrode structure. At block 404, a filtered electrical signal may be obtained from the second electrode structure. At block 406, heat may be transferred to a heatsink region (e.g., the heatsink region 230) of the substrate from an active region (e.g., the active region 246) where the first electrode structure and the second electrode structure excite vibrations in the piezoelectric layer, where the heatsink region is arranged under a first portion of the first electrode structure (e.g., the first portion 234). At block 408, the heatsink region may be electrically insulated, with an insulator region (e.g., the insulator region 232) of the substrate, from an electric field generated by the first electrode structure, where the insulator region is arranged under a second portion of the first electrode structure (e.g., the second portion 236).

In aspects, applying the electrical signal at block 402 may include transducing the electrical signal to an acoustic wave (e.g., the acoustic wave 112) in the piezoelectric layer. Obtaining the filtered electrical signal at block 404 may include transducing the acoustic wave to the filtered electrical signal.

Figure 5:
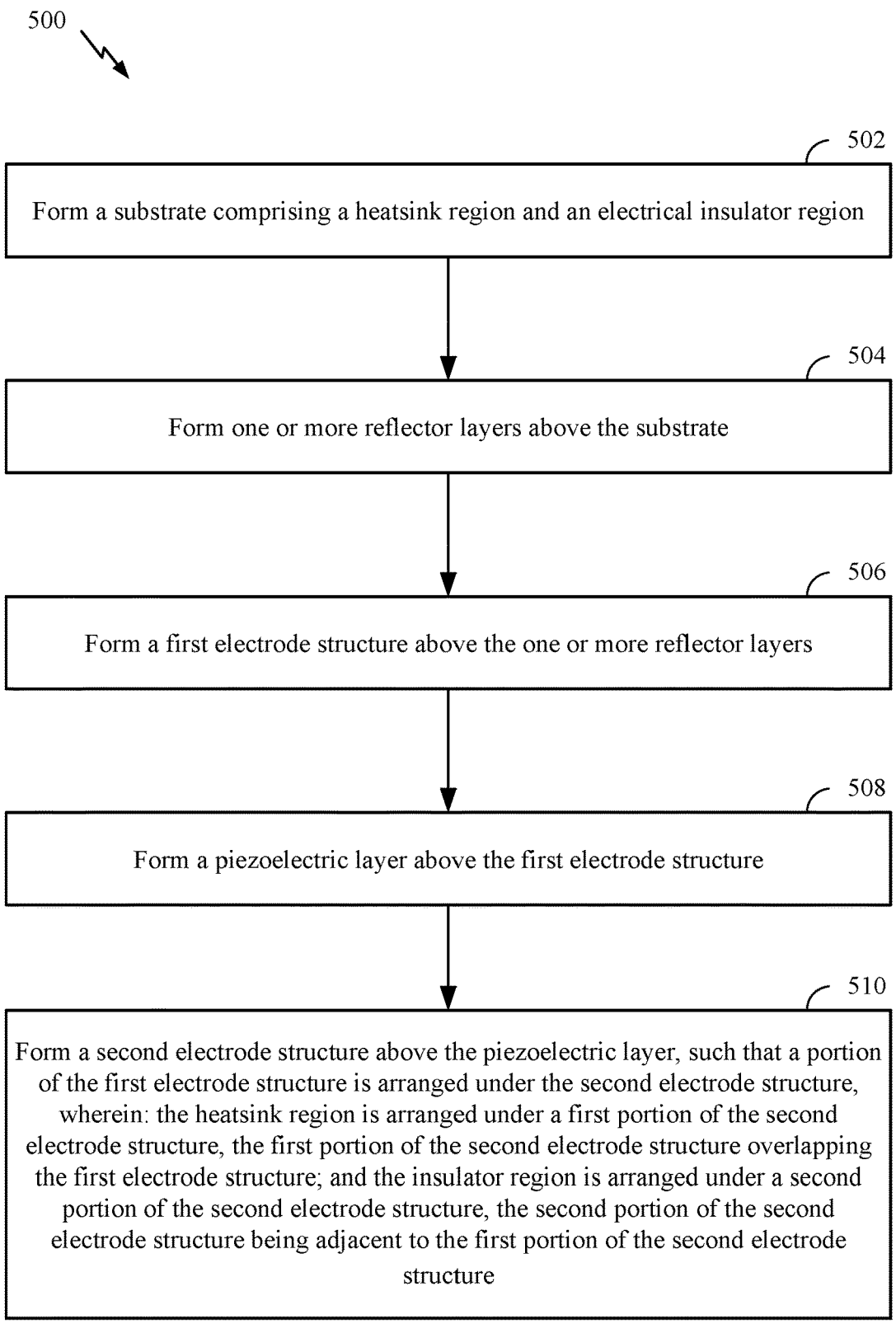
FIG. 5 is a flow diagram illustrating example operations for fabricating an electroacoustic device, in accordance with certain aspects of the present disclosure.

FIG. 5 is a flow diagram illustrating example operations 500 for fabricating an electroacoustic device (e.g., the electroacoustic device 200), in accordance with certain aspects of the present disclosure. The operations 500 may be performed, for example, by an electroacoustic device fabrication facility.

The operations 500 may begin, at block 502, by forming a substrate (e.g., the substrate 210) comprising a heatsink region (e.g., the heatsink region 230) and an electrical insulator region (e.g., the insulator region 232). At block 504, one or more reflector layers (e.g., the reflector layers 208) may be formed above the substrate. At block 506, a first electrode structure (e.g., the second electrode structure 206) may be formed above the one or more reflector layers. At block 508, a piezoelectric layer (e.g., the piezoelectric layer 204) may be formed above the first electrode structure. At block 510, a second electrode structure (e.g., the first electrode structure 202) may be formed above the piezoelectric layer, such that a portion of the first electrode structure is arranged under the second electrode structure. In aspects, the heatsink region is arranged under a first portion (e.g., the first portion 234) of the second electrode structure, the first portion of the second electrode structure overlapping the first electrode structure, and the insulator region is arranged under a second portion (e.g., the second portion 236) of the second electrode structure, the second portion of the second electrode structure being adjacent to the first portion of the second electrode structure.

In certain aspects, forming the substrate at block 502 may involve forming the insulator region or the heatsink region in a cavity. In certain cases, a cavity may be formed in a substrate (such as a silicon wafer), and a dielectric material (e.g., silicon dioxide, silicon nitride, or aluminum nitride) may be formed in the cavity to form the insulator region. In other cases, one or more layers of dielectric material may be formed on the substrate. That is, a silicon wafer may be formed into a silicon-on-insulator (SOI) wafer. A cavity may be formed in the one or more layers of dielectric material, and the heatsink region may be formed in the cavity, such that a remaining portion of the one or more dielectric layers is the insulator region.

Figure 6:
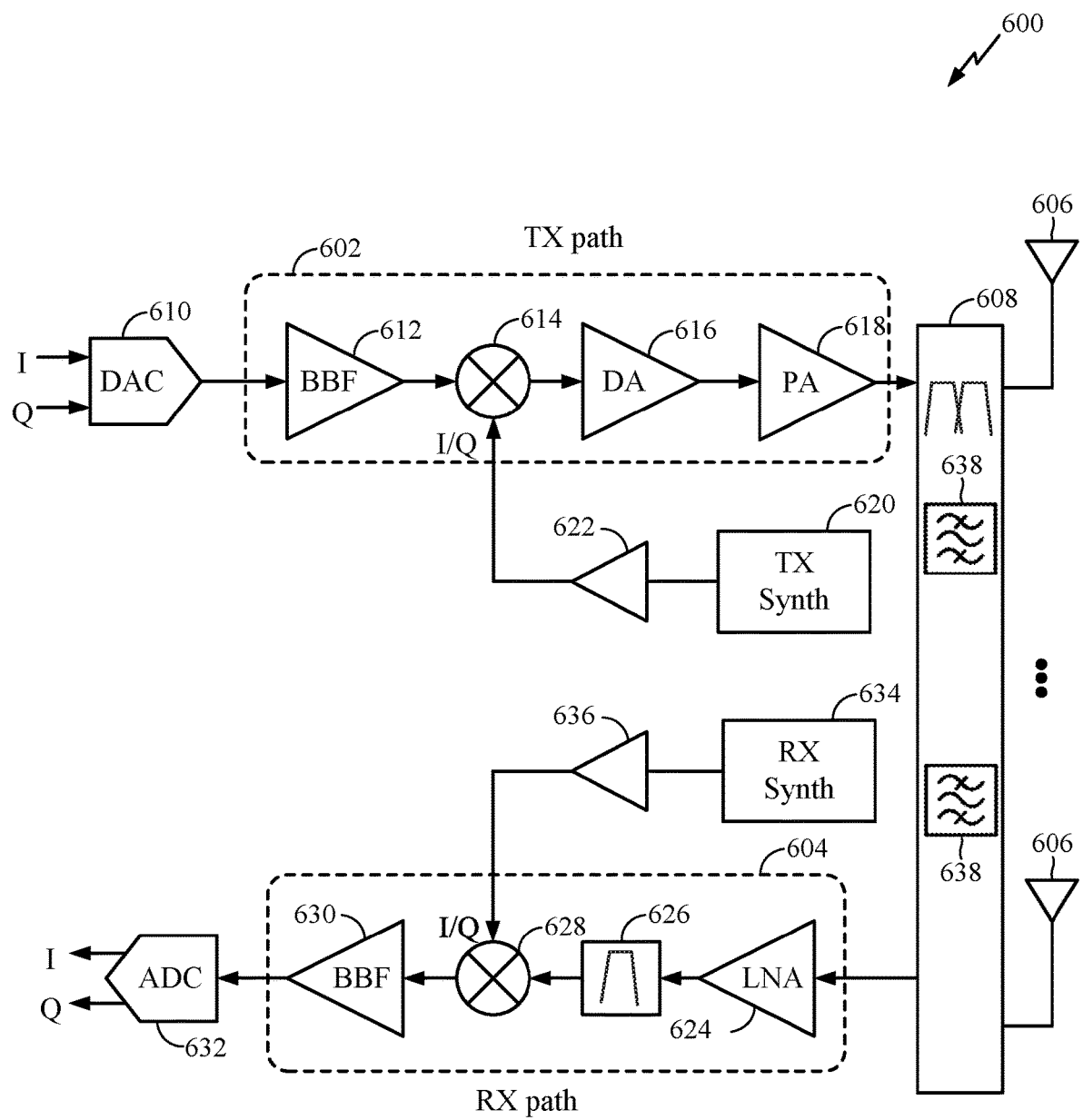
FIG. 6 is a diagram of an example transceiver in which the electroacoustic filter of FIG. 3 may be employed, in accordance with certain aspects of the present disclosure.

In certain aspects, the electroacoustic device described herein may be employed in various circuits (such as an RF transceiver), for example, to serve as an electroacoustic filter or duplexer. FIG. 6 is a block diagram of an example RF transceiver 600, in accordance with certain aspects of the present disclosure. The RF transceiver 600 includes at least one transmit (TX) path 602 (also known as a transmit chain) for transmitting signals via one or more antennas 606 and at least one receive (RX) path 604 (also known as a receive chain) for receiving signals via the antennas 606. When the TX path 602 and the RX path 604 share an antenna 606, the paths may be connected with the antenna via an interface 608, which may include any of various suitable RF devices, such as an electroacoustic filter 638 (e.g., the electroacoustic filter circuit 300), a duplexer (which may include a BAW resonator), a diplexer, a multiplexer, and the like.

Receiving in-phase (I) or quadrature (Q) baseband analog signals from a digital-to-analog converter (DAC) 610, the TX path 602 may include a baseband filter (BBF) 612, a mixer 614, a driver amplifier (DA) 616, and a power amplifier (PA) 618. In certain aspects, the BBF 612, the mixer 614, and the DA 616 may be included in a semiconductor device such as a radio frequency integrated circuit (RFIC), whereas the PA 618 may be external to this semiconductor device.

The BBF 612 filters the baseband signals received from the DAC 610, and the mixer 614 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 614 are typically RF signals, which may be amplified by the DA 616 and/or by the PA 618 before transmission by the antenna 606. In certain cases, the BBF 612 may be implemented using an electroacoustic filter with a BAW resonator (e.g., the electroacoustic filter circuit 300).

The RX path 604 may include a low noise amplifier (LNA) 624, a filter 626, a mixer 628, and a baseband filter (BBF) 630. The LNA 624, the filter 626, the mixer 628, and the BBF 630 may be included in a RFIC, which may or may not be the same RFIC that includes the TX path components. RF signals received via the antenna 606 may be amplified by the LNA 624 and filtered by the filter 626, and the mixer 628 mixes the amplified RF signals with a receive local oscillator (LO) signal to convert the RF signal of interest to a different baseband frequency (e.g., downconvert). The baseband signals output by the mixer 628 may be filtered by the BBF 630 before being converted by an analog-to-digital converter (ADC) 632 to digital I or Q signals for digital signal processing. In certain cases, the filter 626 and/or BBF 630 may be implemented using an electroacoustic filter with a BAW resonator (e.g., the electroacoustic filter circuit 300).

While it is desirable for the output of an LO to remain stable in frequency, tuning to different frequencies indicates using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 620, which may be buffered or amplified by amplifier 622 before being mixed with the baseband signals in the mixer 614. Similarly, the receive LO may be produced by an RX frequency synthesizer 634, which may be buffered or amplified by amplifier 636 before being mixed with the RF signals in the mixer 628.

Figure 7:
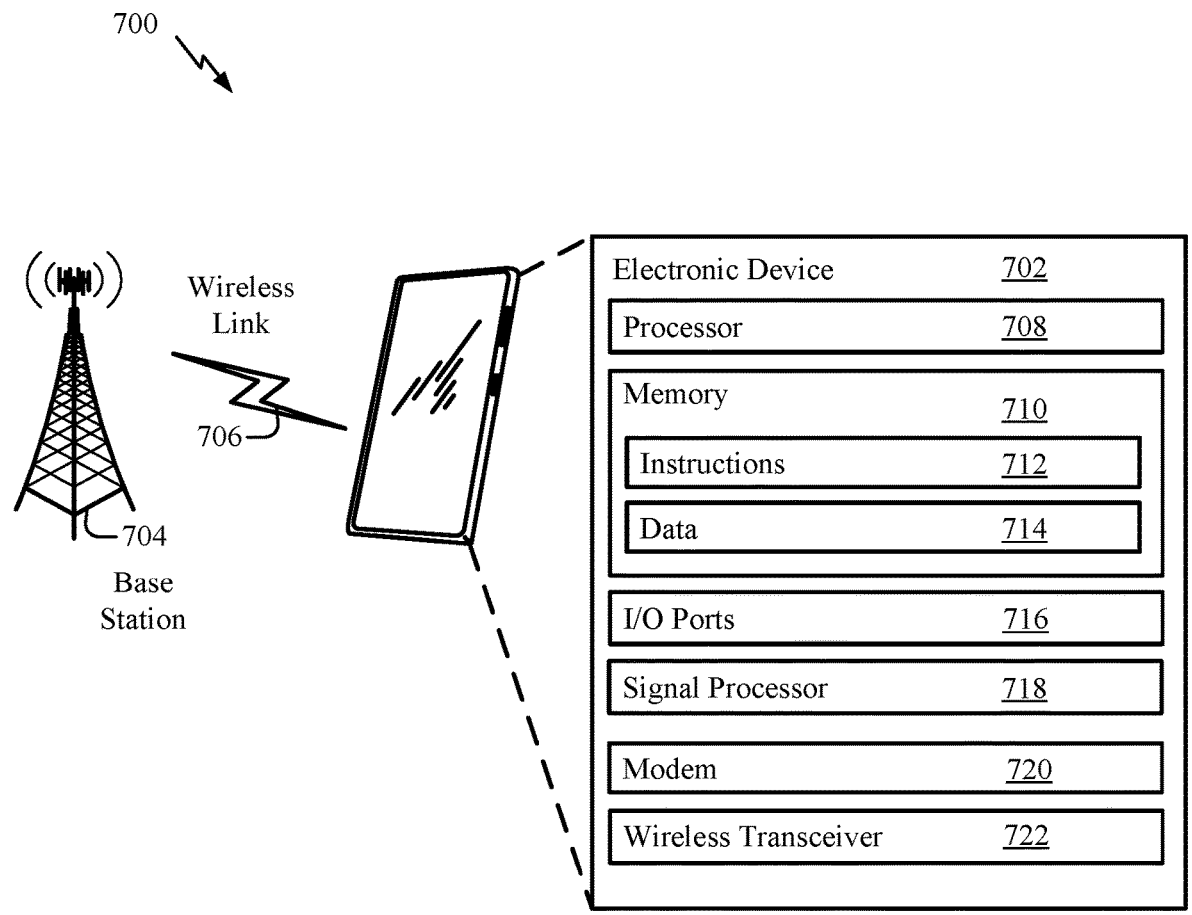
FIG. 7 is a diagram of a wireless communication network that includes a wireless communication device having a transceiver such as the transceiver of FIG. 6, in accordance with certain aspects of the present disclosure.

FIG. 7 is a diagram of an environment 700 that includes a wireless communication device 702, which has a wireless transceiver 796 such as the RF transceiver 600 of FIG. 6. In the environment 700, the wireless communication device 702 communicates with a base station 704 through a wireless link 706. As shown, the wireless communication device 702 is depicted as a smart phone. However, the electronic wireless communication device 702 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 704 communicates with the wireless communication device 702 via the wireless link 706, which may be implemented as any suitable type of wireless link. Although depicted as a base station tower of a cellular radio network, the base station 704 may represent or be implemented as another device, such as a satellite, terrestrial broadcast tower, access point, peer-to-peer device, mesh network node, fiber optic line, another electronic device generally as described above, and so forth. Hence, the wireless communication device 702 may communicate with the base station 704 or another device via a wired connection, a wireless connection, or a combination thereof. The wireless link 706 can include a downlink of data or control information communicated from the base station 704 to the wireless communication device 702 and an uplink of other data or control information communicated from the wireless communication device 702 to the base station 704. The wireless link 706 may be implemented using any suitable communication protocol or standard, such as 3rd Generation Partnership Project Long-Term Evolution (3GPP LTE), 3GPP New Radio Fifth Generation (NR 5G), IEEE 802.11 (WiFi), IEEE 802.16 (WiMAX), Bluetooth™ and so forth.

The wireless communication device 702 includes a processor 708 and a memory 710. The memory 710 may be or form a portion of a computer readable storage medium. The processor 708 may include any type of processor, such as an application processor or a multi-core processor, that is configured to execute processor-executable instructions (e.g., code) stored by the memory 710. The memory 710 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 710 is implemented to store instructions 712, data 714, and other information of the wireless communication device 702, and thus when configured as or part of a computer readable storage medium, the memory 710 does not include transitory propagating signals or carrier waves. That is, the memory 710 may include non-transitory computer-readable media (e.g., tangible media).

The wireless communication device 702 may also include input/output ports 716. The I/O ports 716 enable data exchanges or interaction with other devices, networks, or users or between components of the device.

The wireless communication device 702 may further include a signal processor (SP) 718 (e.g., such as a digital signal processor (DSP)). The signal processor 718 may function similar to the processor 708 and may be capable of executing instructions and/or processing information in conjunction with the memory 710.

For communication purposes, the wireless communication device 702 also includes a modem 720, a wireless transceiver 722, and an antenna (not shown). The wireless transceiver 722 provides connectivity to respective networks and other wireless communication devices connected therewith using radio-frequency (RF) wireless signals and may include the RF transceiver 600 of FIG. 6. The wireless transceiver 722 may facilitate communication over any suitable type of wireless network, such as a wireless local area network (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components.

For example, means for reflecting an acoustic wave may include a Bragg reflector such as the one or more reflector layers 208. Means for transferring heat from an active region may include a heatsink region (e.g., the heatsink region 230) of a substrate (e.g., the substrate 210). Means for electrically insulating the means for transferring heat from an electric field generated by the first electrode structure may include an electrical insulator region (e.g., the insulator region 232) of the substrate.

The following description provides examples of an electroacoustic device for various filtering applications, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An electroacoustic device, comprising:
a piezoelectric layer;
a first electrode structure disposed above the piezoelectric layer;
a second electrode structure disposed below the piezoelectric layer, such that a portion of the second electrode structure is arranged under the first electrode structure;
one or more reflector layers disposed below the second electrode structure; and
a substrate disposed below the one or more reflector layers, such that the substrate is arranged under the first electrode structure and the second electrode structure, wherein:
the substrate comprises a heatsink region and an electrical insulator region;
the heatsink region is arranged under a first portion of the first electrode structure, the first portion of the first electrode structure overlapping the second electrode structure; and
the insulator region is arranged under a second portion of the first electrode structure, the second portion of the first electrode structure being adjacent to the first portion of the first electrode structure.

2. The electroacoustic device of claim 1, wherein the insulator region is coupled to a lateral surface of the heatsink region, which is aligned with a junction between the first portion of the first electrode structure and the second portion of the first electrode structure.

3. The electroacoustic device of claim 1, wherein the heatsink region comprises silicon.

4. The electroacoustic device of claim 1, wherein the insulator region includes at least one of silicon dioxide, aluminum nitride, or silicon nitride.

5. The electroacoustic device of claim 1, wherein the insulator region has an upper surface aligned within an upper surface of the heatsink region.

6. The electroacoustic device of claim 1, wherein the second portion of the first electrode structure partially overlaps the second electrode structure.

7. The electroacoustic device of claim 1, wherein the one or more reflector layers comprise a metal layer and a dielectric layer disposed between the second electrode structure and the substrate.

8. The electroacoustic device of claim 7, wherein the metal layer comprises tungsten, and wherein the dielectric layer comprises silicon dioxide or aluminum nitride.

9. The electroacoustic device of claim 7, wherein a portion of the metal layer is arranged under the first electrode structure and the second electrode structure, such that the portion of the metal layer extends past the second electrode structure.

10. The electroacoustic device of claim 1, wherein the electroacoustic device is a bulk acoustic wave resonator.

11. The electroacoustic device of claim 10, wherein the bulk acoustic wave resonator is a solidly mounted resonator.

12. A wireless communication apparatus comprising the electroacoustic device of claim 1, the wireless communication apparatus further comprising an antenna coupled to the electroacoustic device.

13. A method of filtering an electrical signal via an electroacoustic device comprising a piezoelectric layer, a first electrode structure disposed above the piezoelectric layer, a second electrode structure disposed below the piezoelectric layer, one or more reflector layers disposed below the second electrode structure, and a substrate disposed below the one or more reflector layers, the method comprising:
applying the electrical signal to the first electrode structure;
obtaining a filtered electrical signal from the second electrode structure;
transferring heat to a heatsink region of the substrate from an active region where the first electrode structure and the second electrode structure excite vibrations in the piezoelectric layer, wherein the heatsink region is arranged under a first portion of the first electrode structure, the first portion of the first electrode structure overlapping the second electrode structure; and electrically insulating, with an insulator region of the substrate, the heatsink region from an electric field generated by the first electrode structure, wherein the insulator region is arranged under a second portion of the first electrode structure, the second portion of the first electrode structure being adjacent to the first portion of the first electrode structure.

14. The method of claim 13, wherein applying the electrical signal comprises transducing the electrical signal to an acoustic wave in the piezoelectric layer.

15. The method of claim 14, wherein obtaining the filtered electrical signal comprises transducing the acoustic wave to the filtered electrical signal.

16. A method of fabricating an electroacoustic device, comprising:
  forming a substrate comprising a heatsink region and an electrical insulator region;
  forming one or more reflector layers above the substrate;
  forming a first electrode structure above the one or more reflector layers;
  forming a piezoelectric layer above the first electrode structure; and
  forming a second electrode structure above the piezoelectric layer, such that a portion of the first electrode structure is arranged under the second electrode structure, wherein:
    the heatsink region is arranged under a first portion of the second electrode structure, the first portion of the second electrode structure overlapping the first electrode structure; and
    the insulator region is arranged under a second portion of the second electrode structure, the second portion of the second electrode structure being adjacent to the first portion of the second electrode structure.

17. The method of claim 16, wherein forming the substrate comprises:
  forming a cavity in the substrate; and
  depositing a dielectric material in the cavity to form the insulator region.

18. The method of claim 16, wherein forming the substrate comprises:
  forming one or more layers of dielectric material on the substrate;
  forming a cavity in the one or more layers of dielectric material; and
  forming the heatsink region in the cavity, such that a remaining portion of the one or more layers of dielectric material is the insulator region.

19. An electroacoustic device, comprising:
  a piezoelectric layer;
  a first electrode structure disposed above the piezoelectric layer;
  a second electrode structure disposed below the piezoelectric layer, such that a portion of the second electrode structure is arranged under the first electrode structure;
  means for reflecting an acoustic wave disposed below the second electrode structure; and
  a substrate disposed below the means for reflecting, such that the substrate is arranged under the first electrode structure and the second electrode structure,
  wherein the substrate comprises:
    means for transferring heat from an active region where the first electrode structure and the second electrode structure excite vibrations in the piezoelectric layer, and
    means for electrically insulating the means for transferring heat from an electric field generated by the first electrode structure, wherein:
      the means for transferring heat is arranged under a first portion of the first electrode structure, the first portion of the first electrode structure overlapping the second electrode structure; and
      the means for electrically insulating is arranged under a second portion of the first electrode structure, the second portion of the first electrode structure being adjacent to the first portion of the first electrode structure.

20. The electroacoustic device of claim 19, wherein the means for electrically insulating is coupled to a lateral surface of the means for transferring heat, which is aligned with a junction between the first portion of the first electrode structure and the second portion of the first electrode structure.

21. The electroacoustic device of claim 19, wherein the means for transferring heat comprises silicon.

22. The electroacoustic device of claim 19, wherein the means for electrically insulating includes at least one of silicon dioxide, aluminum nitride, or silicon nitride.

23. The electroacoustic device of claim 19, wherein the means for electrically insulating has an upper surface aligned within an upper surface of the means for transferring heat.

24. The electroacoustic device of claim 19, wherein the second portion of the first electrode structure partially overlaps the second electrode structure.

25. The electroacoustic device of claim 19, wherein the means for reflecting comprises a metal layer and a dielectric layer disposed between the second electrode structure and the substrate metal layer.

26. The electroacoustic device of claim 25, wherein the metal layer comprises tungsten, and wherein the dielectric layer comprises silicon dioxide or aluminum nitride.

27. The electroacoustic device of claim 25, wherein a portion of the metal layer is arranged under the first electrode structure and the second electrode structure, such that the portion of the metal layer extends past the second electrode structure.

* * * * *